(12) United States Patent
Ingelhag et al.

(10) Patent No.: US 11,497,119 B2
(45) Date of Patent: Nov. 8, 2022

(54) CARRIER SUBSTRATE, AN ELECTRONIC ASSEMBLY AND AN APPARATUS FOR WIRELESS COMMUNICATION

(71) Applicant: Telefonaktiebolaget LM Ericsson (publ), Stockholm (SE)

(72) Inventors: Per Ingelhag, Alingsås (SE); Peter Melin, Lindome (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/270,910

(22) PCT Filed: Oct. 2, 2018

(86) PCT No.: PCT/EP2018/076791
§ 371 (c)(1),
(2) Date: Feb. 24, 2021

(87) PCT Pub. No.: WO2020/069727
PCT Pub. Date: Apr. 9, 2020

(65) Prior Publication Data
US 2021/0219428 A1 Jul. 15, 2021

(51) Int. Cl.
*H05K 1/11* (2006.01)
*H05K 1/02* (2006.01)
(Continued)

(52) U.S. Cl.
CPC ........... *H05K 1/144* (2013.01); *H05K 1/0206* (2013.01); *H05K 1/0243* (2013.01);
(Continued)

(58) Field of Classification Search
CPC ............... H05K 1/0201; H05K 1/0203; H05K 7/20218; H05K 7/20254; H05K 7/20263;
(Continued)

(56) References Cited

U.S. PATENT DOCUMENTS 8,411,444 B2 4/2013 Gaynes et al.
2008/0253085 A1* 10/2008 Soffer ................. F28D 15/0275
361/679.46
(Continued)

FOREIGN PATENT DOCUMENTS

EP 2053906 A2 4/2009

OTHER PUBLICATIONS

Fan, A. et al., "An Innovative Passive Cooling Method for High Performance Light-Emitting Diodes", 2012 28th Annual IEEE Semiconductor Thermal Measurement and Management Symposium (SEMI-THERM), Mar. 18, 2012, pp. 319-324, IEEE.

*Primary Examiner* — Hoa C Nguyen
(74) *Attorney, Agent, or Firm* — Coats & Bennett, PLLC

(57) ABSTRACT

The present invention relates to a carrier substrate (30) comprising signal vias (41) for electrically interconnecting components (10, 31) arranged on opposing sides of the carrier substrate (30). The carrier substrate (30) further comprises: at least one cavity (20) embedded in the carrier substrate (30) having at least one chamber wick part (24) and a working fluid, and wherein the at least one cavity (20) at least partially encompass the signal vias (41). The present invention also relates to an electronic assembly and an apparatus for wireless communication comprising the carrier substrate (30).

19 Claims, 10 Drawing Sheets

(51) Int. Cl.
    *H05K 1/14* (2006.01)
    *H05K 1/18* (2006.01)
(52) U.S. Cl.
    CPC ........... *H05K 1/0272* (2013.01); *H05K 1/181* (2013.01); *H05K 2201/10098* (2013.01); *H05K 2201/10545* (2013.01)
(58) Field of Classification Search
    CPC ............ H05K 7/2029; H05K 7/20336; H05K 2201/064; H05K 1/144; H05K 1/0246; H05K 1/0243; H05K 1/0272; H05K 1/181; H05K 2201/10098; H05K 2201/10545; H05K 1/11–114
    See application file for complete search history.

(56) References Cited

U.S. PATENT DOCUMENTS

| | | | |
|---|---|---|---|
| 2009/0065180 A1 | 3/2009 | Wits et al. | |
| 2014/0198825 A1* | 7/2014 | Tsai | G01K 3/04 |
| | | | 374/178 |
| 2015/0003017 A1* | 1/2015 | Tantolin | H05K 7/20009 |
| | | | 361/701 |
| 2016/0091258 A1 | 3/2016 | Ahamed et al. | |
| 2017/0273172 A1 | 9/2017 | Ligander et al. | |
| 2017/0325327 A1* | 11/2017 | Smith | H05K 1/021 |
| 2018/0153030 A1* | 5/2018 | Viswanathan | H01L 23/427 |

* cited by examiner

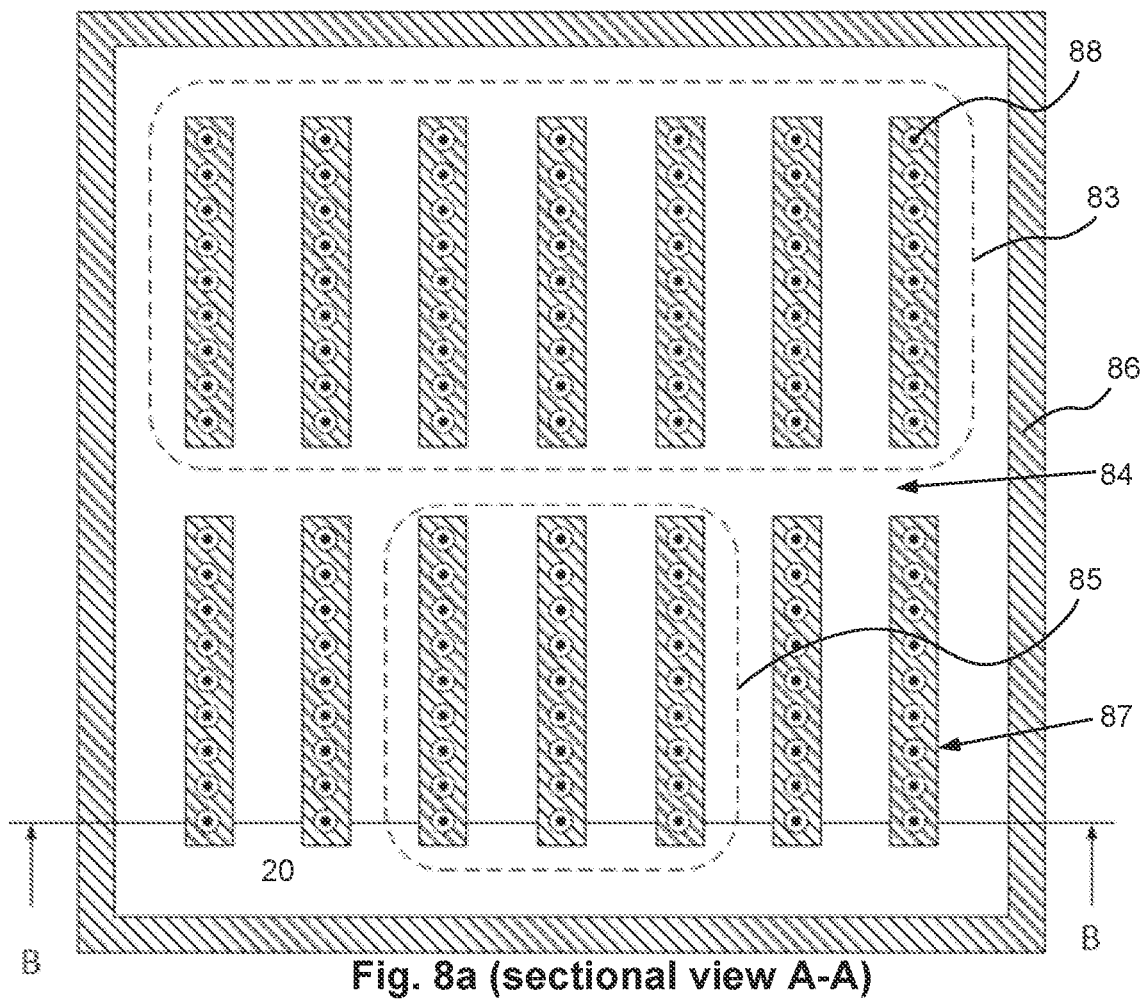
Fig. 8a (sectional view A-A)
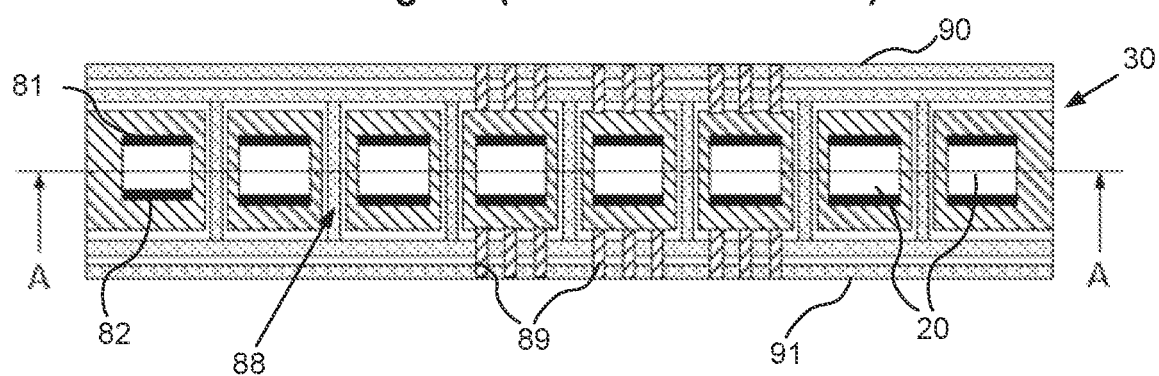
Fig. 8b (sectional view B-B)

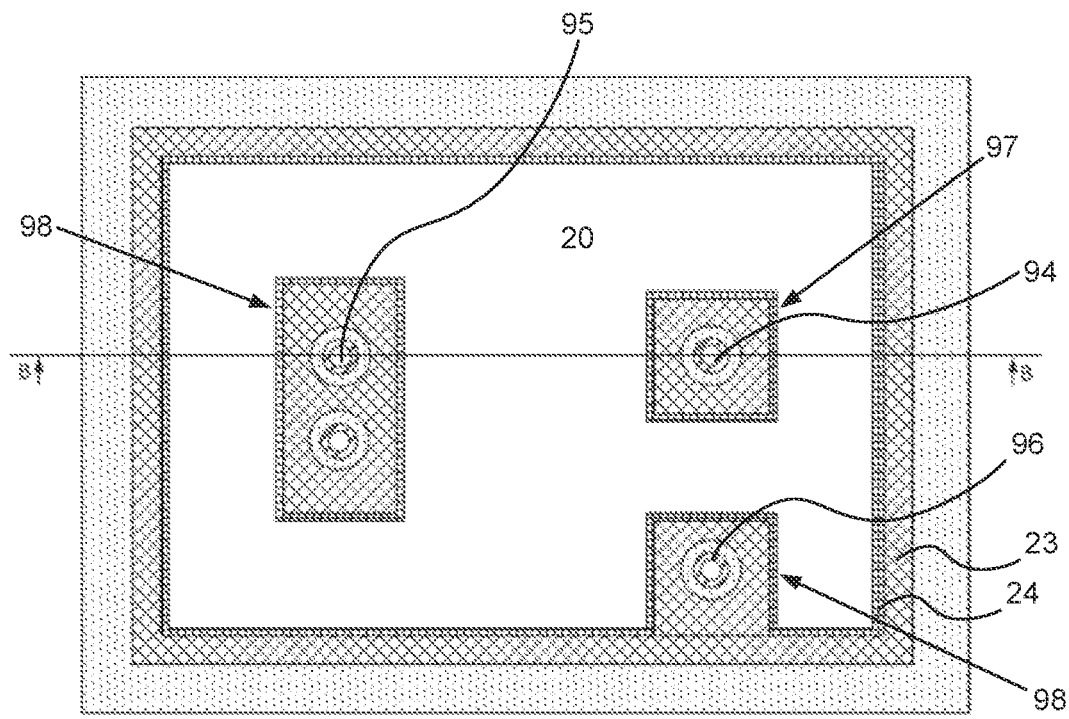
Fig. 9a (sectional view A-A)
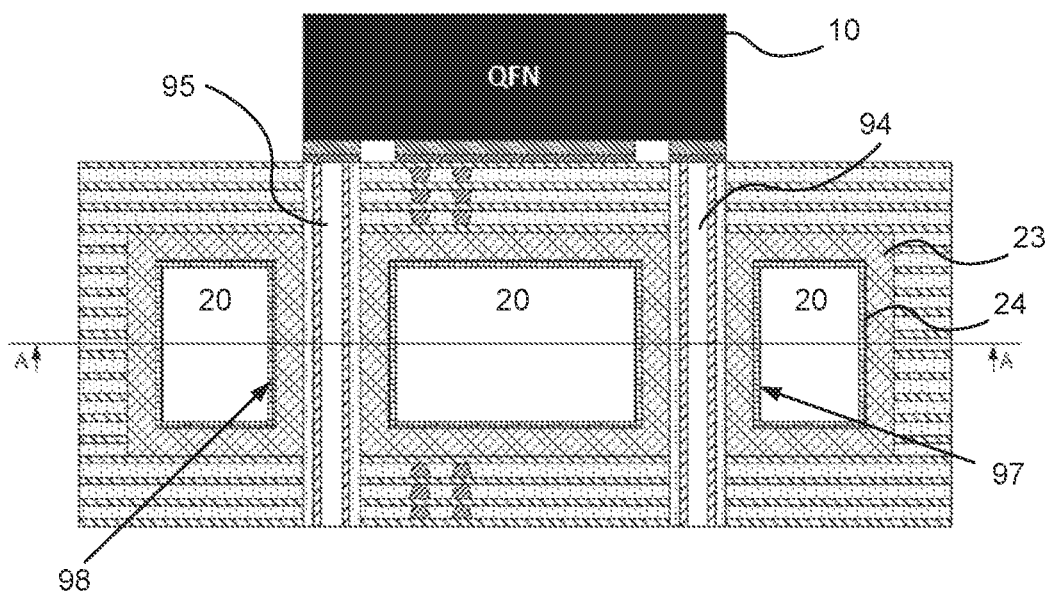
Fig. 9b (sectional view B-B)

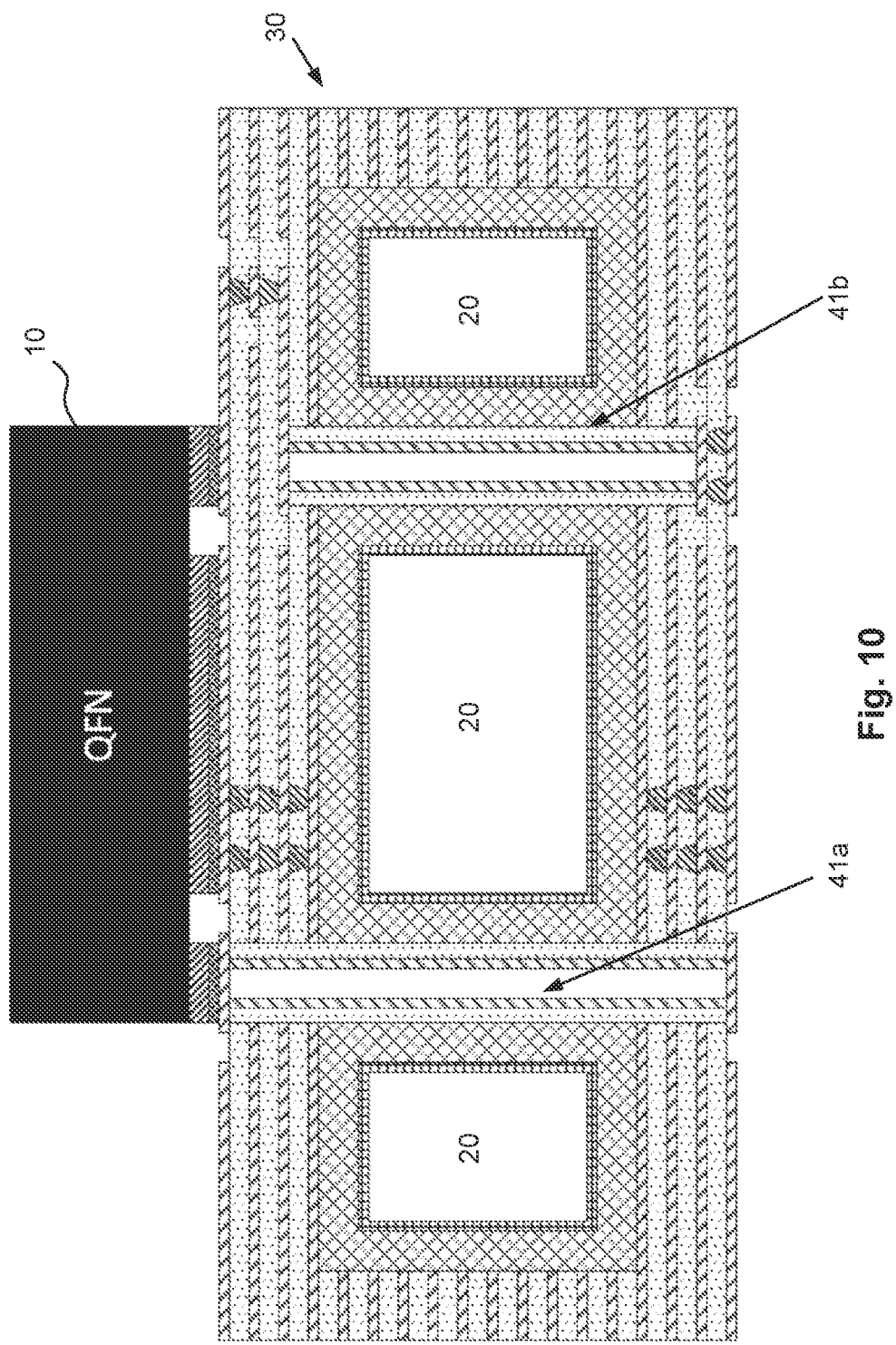

CARRIER SUBSTRATE, AN ELECTRONIC ASSEMBLY AND AN APPARATUS FOR WIRELESS COMMUNICATION

TECHNICAL FIELD

The present disclosure relates to the field of cooling components mounted on a carrier substrate, such as a Printed Circuit Board. More particular, the invention relates to a vapor chamber based heat-spreader with signal via in a carrier substrate.

BACKGROUND

In a 5G mm wave system, an antenna array can comprise say 64 elements in an 8×8 matrix, each antenna element with a size of 3.5×3.5 to 6×6 mm, targeting frequencies between 24 and 40 GHz.

Many different mounting and cooling options exist with different characteristics. Typically, the antenna is placed on one side of a Printed Circuit Board (PCB), also known as antenna carrier board, radiating in one in direction from one side of the PCB. This side cannot easily be used for cooling. A Front-End Power Amplifier (FE PA) is ideally placed close to the antenna element for lowest Insertion Loss (IL), meaning higher efficiency. Between the FE PA and antenna element, a channel filter is usually inserted. The filter can be integrated in the antenna, be a separate component/structure, or as a strip line in the PCB.

Below is a brief description of different mounting options of the FE PA in relation to the antenna element on the antenna carrier board (not extensive described but resulting in one layer of heat generating electronic components.

The antenna elements of the antenna array can be mounted as a component or integrated as part of the antenna carrier board with FE PA mounted on the opposite side of the antenna array area. This solution is close to optimal from a IL point of view due to the short distance between the antenna element and the FE PA. The drawback is it typically requires cooling from the top-side of the FE-PA to an attached cooling device. FE PA is usually a QFN cooling down device, even if other solution exists (flip-chip cooling up). All FE-PA in the array area means a significant hotspot and good heat-spreading/conduction is mandatory for the cooling system. The FE PA components are typically attached to a heatsink with a gap-pad solution to handle the mechanical tolerances, with an impairment for the cooling performance.

The antenna array elements can be mounted as a component or integrated as part of the antenna carrier board with FE PA mounted outside the antenna array area for cooling reasons. This is typically the case for Quad Flat No-leads (QFN) packaged FE PA, where cooling is obtained through thermal vias in the antenna carrier board for cooling from the opposite side. The drawback is higher insertion loss due to the distance between antenna element and FE PA. The advantage is less signal congestion and a possibility to fit filter solutions.

The antenna elements of the antenna array can be mounted as a component stacked on the FE PA component on the same side of the antenna carrier PCB. The IL is low, but a significant hot-spot is generated, which requires cooling by thermal vias in the carrier PCB with an attached cooling heat spreader. This usually prevents functions on the opposite side of the antenna array, which would hinder cooling of the FE electronics. Massive thermal vias can also cause signal routing difficulties to/from the FE electronics.

Below, two types of standard cooling solutions are described.

QFN based FE-PA (the most common FE-PA package with cooling down) need to be place on the side of the antenna array either causing larger insertion loss if placed outside the antenna area or creating a signal congestion if stacked under the antenna with cooling vias to the opposite heat-sink side.

Flip-Chip (FC) based package can be mounted on the opposite side of the antenna array, but still causing a significant hot spot, not allowing other electronics in this area. The FC approach has a larger mechanical tolerance to the heat-sink and typically needs a gap-pad on a small hot-spot area with impairment in the thermal performance.

No simple solution exists to mount and use heat generating components on both sides of the antenna carrier board/PCB due to the heat generation.

Thus, there is a need for an improved cooling solution for heat generating components.

SUMMARY

An object of the present disclosure is to provide a carrier substrate which seeks to mitigate, alleviate, or eliminate one or more of the above-identified deficiencies in the art and disadvantages singly or in any combination and to provide an improved cooling.

This object is obtained by a carrier substrate comprising signal vias for electrically interconnecting components arranged on opposing sides of the carrier substrate, and the carrier substrate further comprises at least one cavity embedded in the carrier substrate having at least one chamber wick part and working fluid, and wherein the at least one cavity at least partially encompasses the signal vias.

This object is also obtained by an electronic assembly comprising a first heat generating component thermally connected to a first side of a carrier substrate comprising signal vias for electrically interconnecting components arranged on opposing sides of the carrier substrate. The carrier substrate further comprises at least one cavity embedded in the carrier substrate having at least one chamber wick part and working fluid, wherein the at least one cavity at least partially encompass the signal vias. The first heat generating component is electrically connected to a second component arranged on a second side, opposite of the first side, of the carrier substrate using the signal vias.

An advantage that a carrier substrate having a cavity with chamber wick parts, such as a vapor chamber or heat pipe, has several order of magnitudes better thermal conductivity to spread heat out from a hot-spot generated with the effort to minimize insertion loss, between electrically connected components, to a larger cooling area.

Further objects and advantages may be found in the detailed description.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

FIGS. 8a and 8b illustrate sectional views of a cooling structure including a laminated vapor chamber in a carrier substrate with signal through vias;

FIGS. 9a and 9b illustrate sectional views of signal vias in a vapor chamber; and FIG. 10 illustrate some examples of signals vias.

DETAILED DESCRIPTION

Figure 1A:
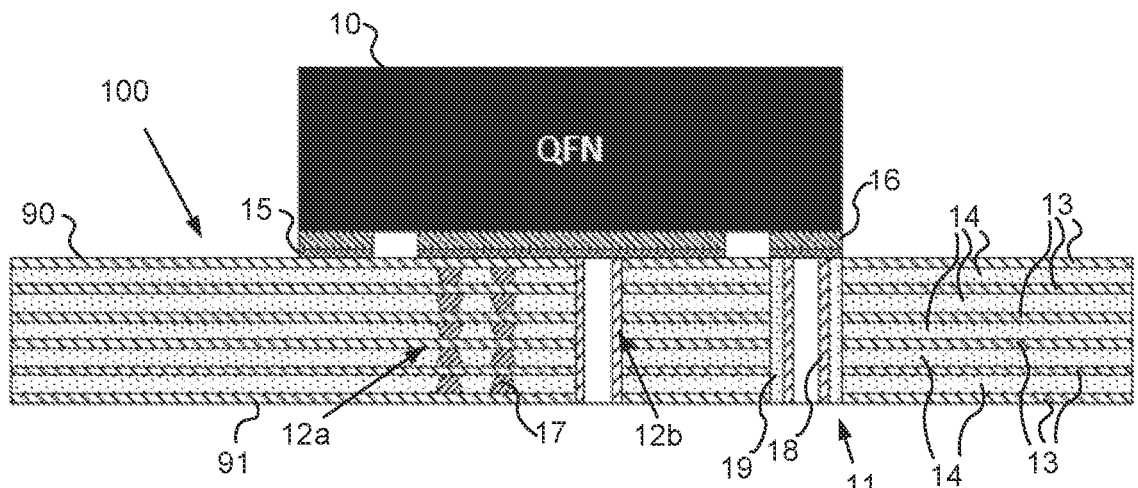
FIGS. 1a-1c illustrate prior art embodiments of cooling solutions without a vapor chamber in a carrier substrate with mounted heat generating components.

Aspects of the present disclosure will be described more fully hereinafter with reference to the accompanying drawings. The carrier substrate, electronic assembly and apparatus disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Some of the example embodiments presented herein are directed towards vapor chamber based heat-spreader with mm-wave coax vertical interconnect access (via). As part of the development of the example embodiments presented herein, a problem will first be identified and discussed.

Heat generated by components mounted on Printed Circuit Boards (PCB) needs to be taken into consideration when designing electronic assemblies intended to be installed in different devices. However, other aspects need to be taken into consideration, such as signal congestion, size, etc. Thus, a more efficient cooling solution is desired for a more compact design.

The introduction of a cavity with wick structures, such as a vapor chamber or heat pipes, within the PCB is an important feature to facilitate heat spreading in the PCB. The advantage of the vapor chamber/heat pipe based heat spreader vs conventional PCB (potentially with a copper core for heat spreading) is several order of magnitude better thermal conductivity to spread heat out from a hot-spot generated with the effort to minimize insertion loss, to a larger cooling area. The proposed solution enables functions on both sides of the PCB, which results in less signal congestion due to less blocking thermal vias. Alternatively several integrated thin heat pipes may be provided.

A cavity based heat-spread, e.g. a vapor chamber based heat-spread or heat pipe based heat-spread, is proposed as an integrated part of the PCB, laminated as a core with heat-spreading functionality. The cavity is equipped with a plurality of mm wave vertical interconnect accesses (aka signal vias), providing interconnection between the two sides of the PCB. The proposed setup enables significantly heat-generating components to be place in a small area in close proximity to a heat generating component, such as antenna elements of an antenna array for low IL. Heat generating components can be placed on both sides of the PCB and connected using the through signal vias. According to some embodiments, the heat generating components can be soldered on the PCB with thermal vias to the vapor chamber, avoiding gap pads. According to some embodiments, the components mounted on the opposite side of the heat generating components, e.g. antenna elements of the antenna array, have a combined cooling solution, with cooling down (QFN) to the cavity and cooling up (FC) to an attached heat spreader/sink. This could enable cooling of complex modules (combined QFN/FC).

Figure 1B:
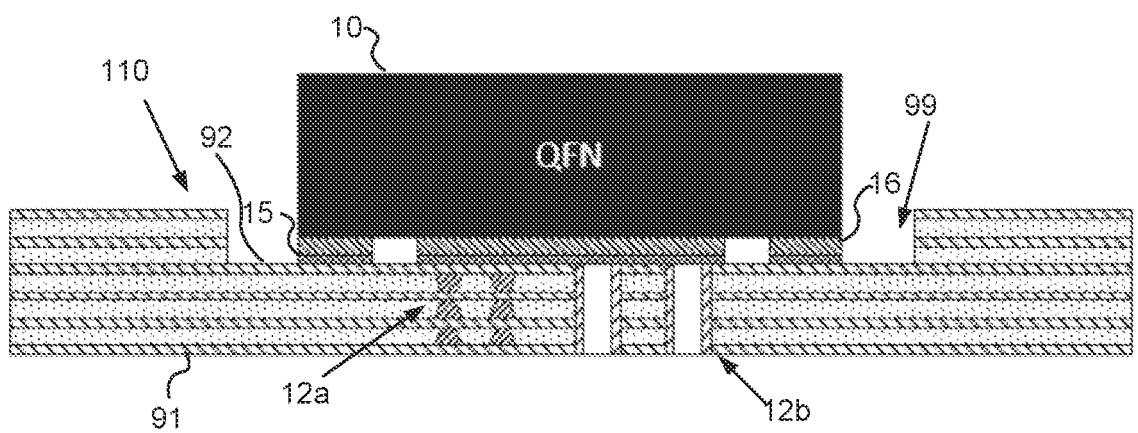
Figure 1C:
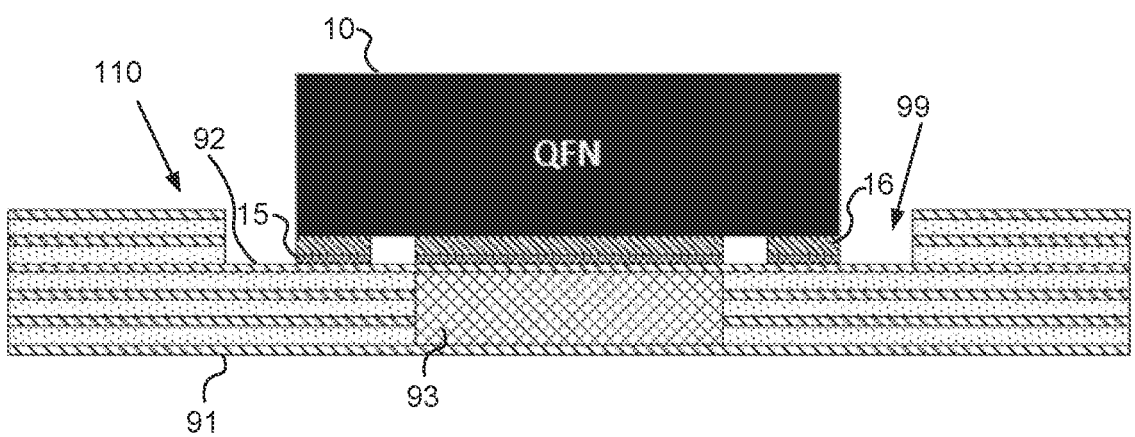

FIGS. 1a-1c illustrate prior art embodiments of cooling solutions without a vapor chamber or heat pipe in a carrier substrate with mounted heat generating components.

FIG. 1a illustrates a Quad Flat No-leads (QFN) package 10 on a carrier substrate, in this embodiment illustrated as a printed circuit board (PCB) 100, with signal vias 11 and thermal vias 12a as micro via stack or 12b as plated through-hole via. The PCB comprises in this embodiment six copper layers 13 used for ground/signal/power. A dielectric layer 14 is positioned between each adjacent copper layer 13. The QFN 10, which may have a plastic mold or ceramic housing (not limited to these examples) and being mounted to a top side 90 of the PCB, is soldered or attached, indicated by 15, to the top copper layer 12 via a copper pad 16 on the QFN 10.

Each thermal via 12 comprises a micro-via 17 between each adjacent copper layer 13 to form a thermal connection between copper pad 16 on the QFN 10 and a bottom side 91 (opposing the top side 90) of the PCB 100. A heat sink (not shown) may be mounted to the bottom side 91 to radiate heat away from the PCB. The signal via 11 comprises a plated through hole (PTH) 18 that pass through the PCB 100 completely and is surrounded by a dielectric material 19 after PCB lamination.

FIG. 1b illustrates a Quad Flat No-leads (QFN) package 10 mounted in a recess 99 on a carrier substrate 110 similar to FIG. 1a. The copper pad 16 is in this embodiment soldered or attached to the third copper layer 92. The recess reduces the PCB thickness (i.e. thermal resistance to the bottom side 91 under the QFN package).

FIG. 1c illustrates a Quad Flat No-leads (QFN) package 10 mounted in a recess 99 on a carrier substrate 110 which may be combined with the embodiment disclosed in FIG. 1a or 1b. The copper pad 16 is in this embodiment soldered or attached to the third copper layer 92. The recess reduces the PCB thickness (i.e. thermal resistance to the bottom side 91 under the QFN package. A copper "coin" 93 is laminated as a complement to thermal vias (not shown) to reduce thermal resistance and achieve heat spreading in the carrier substrate, i.e. PCB in this embodiment.

Figure 2A:
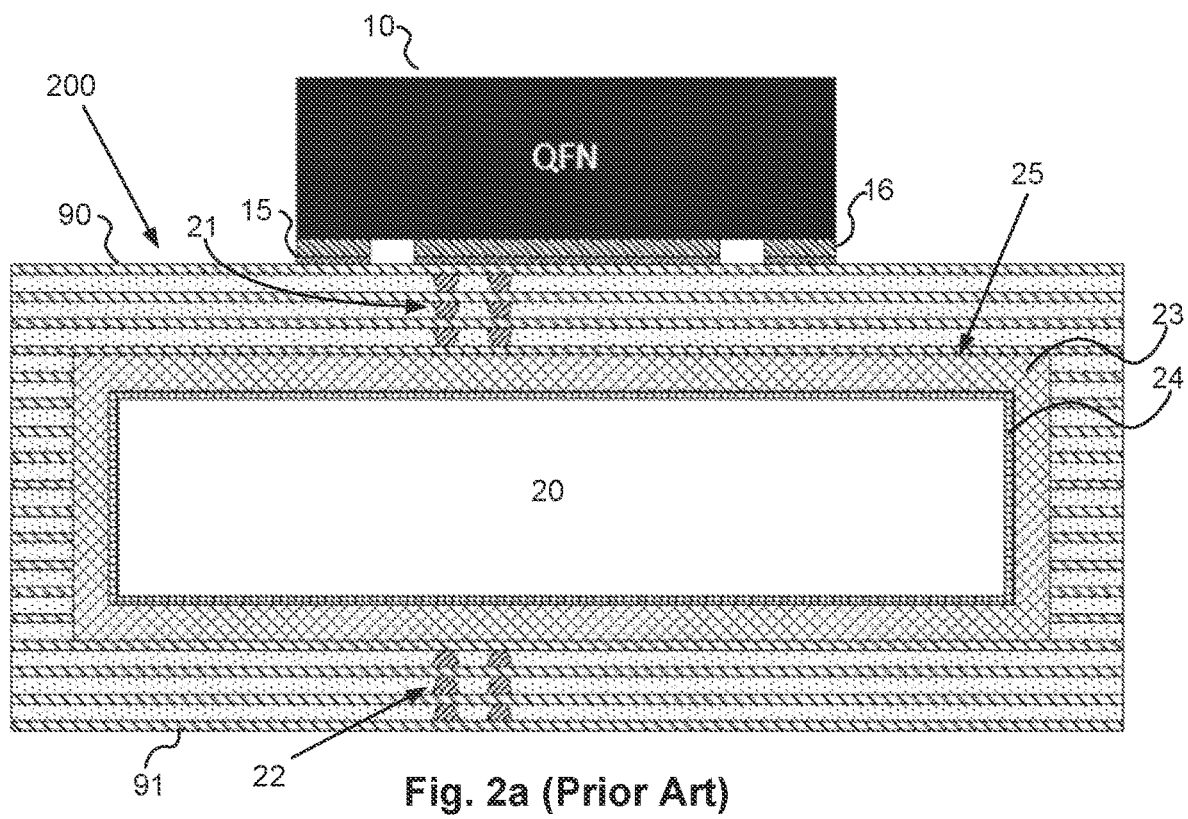
FIGS. 2a and 2b illustrate prior art embodiments of cooling solutions with a cavity in a carrier substrate with mounted heat generating components.
Figure 2B:
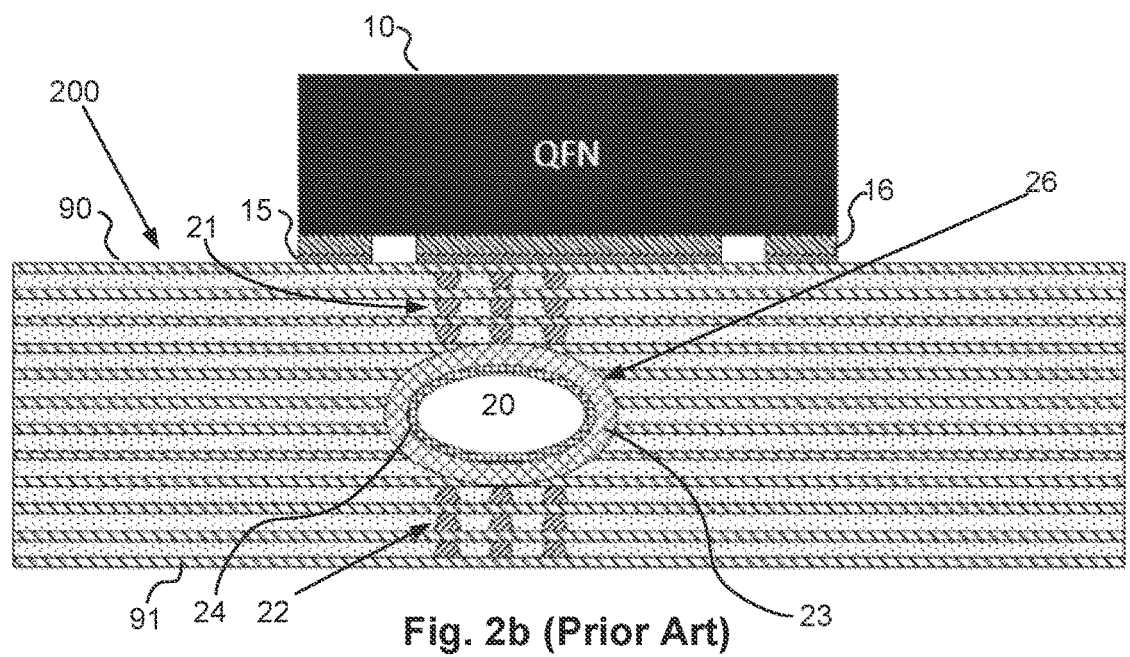

FIGS. 2a and 2b illustrate prior art embodiments of cooling solutions using a cavity in a carrier substrate 200 with mounted heat generating components. In these embodiments the substrate carrier 200 is illustrated as a PCB with a laminated structure. Two different types of cavities are illustrated, vapor chamber (FIG. 2a) and heat pipe (FIG. 2b). The operation is well known to a skilled person and a short description is provided below.

A typical heat pipe or vapor chamber consists of a sealed cavity of a material, such as copper or aluminum, that is compatible with the working fluid. The cavity is partially filled with a working fluid and then sealed. The working fluid mass is chosen so that the heat pipe/vapor chamber contains both vapor and liquid over the operating temperature range, and the system is operating in a low pressure environment.

Below the operating temperature, the liquid is too cold and cannot vaporize into a gas. Above the operating temperature, all the liquid has turned to gas, and the environmental temperature is too high for any of the gas to condense. Whether too high or too low, thermal conduction is still possible through the walls of the heat pipe/vapor chamber, but at a greatly reduced rate of thermal transfer.

Working fluids are chosen according to the temperatures at which the heat pipe/vapor chamber must operate, with examples ranging from liquid helium for extremely low temperature applications (2-4 K) to mercury (523-923 K), sodium (873-1473 K) and even indium (2000-3000 K) for extremely high temperatures. The vast majority of heat pipes/vapor chamber for room temperature applications use ammonia (213-373 K), alcohol (methanol (283-403 K) or ethanol (273-403 K)) or water (298-573 K) as the working fluid. Copper/water heat pipes/vapor chambers have a copper envelope, use water as the working fluid and typically operate in the temperature range of 20 to 150° C. Water heat pipes/vapor chamber are sometimes filled by partially filling with water, heating until the water boils and displaces the air, and then sealed while hot.

For the heat pipe/vapor chamber to transfer heat, it must contain saturated liquid and its vapor (gas phase). The saturated liquid vaporizes and travels to the condenser, where it is cooled and turned back to a saturated liquid. The condensed liquid is returned to the evaporator using a wick structure exerting a capillary action and/or gravity on the liquid phase of the working fluid. Wick structures used in heat pipes/vapor chambers include sintered metal powder, screen, and grooved wicks, which have a series of grooves parallel to the pipe axis. Heat pipes/vapor chambers contain no mechanical moving parts and typically require no maintenance.

FIG. 2a illustrates a QFN package 10 mounted to a top side 90 of the carrier substrate 200 and thermally connected to a vapor chamber 25 by thermal vias 21. Additional thermal vias 22 thermally connect the vapor chamber to a bottom side 91 of the substrate carrier 200. The vapor chamber 25 having a cavity 20 which is provided with a working fluid, and the cavity contains saturated liquid and its vapor (gas phase). Copper walls 23 surround the cavity 20 of the vapor chamber. On the copper walls 23 there is a chamber wick part 24 of sintered copper powder. The function of the wick part is to move liquid by capillary forces.

FIG. 2b illustrates an alternative solution wherein the vapor chamber 25 is replaced with a heat pipe 26, having a cavity 20 surrounded by copper walls 23 and chamber wick part 24 of sintered copper powder.

Figure 3A:
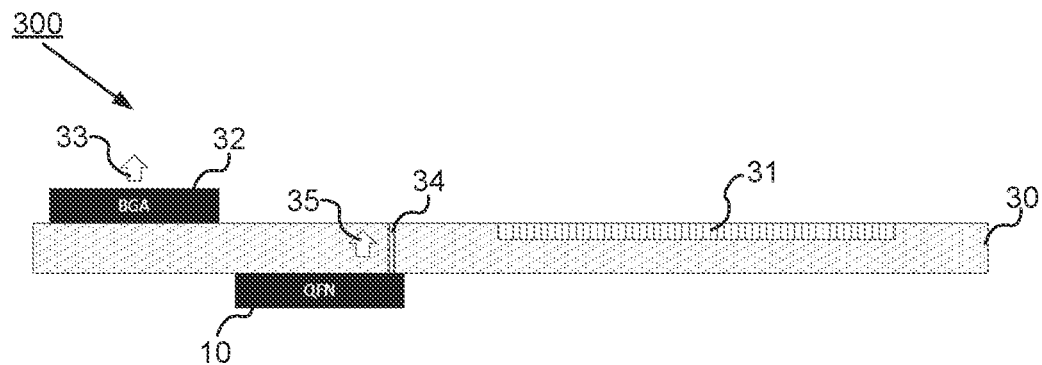
FIGS. 3a-3c illustrate building practice examples of prior art embodiments.
Figure 3B:
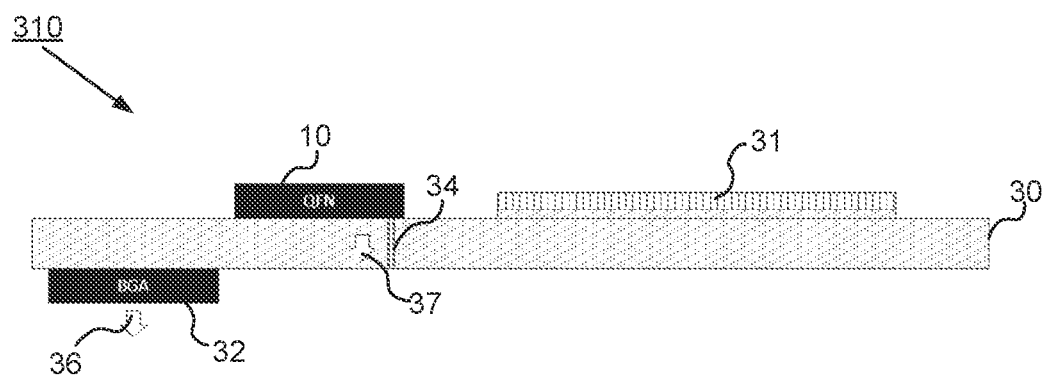
Figure 3C:
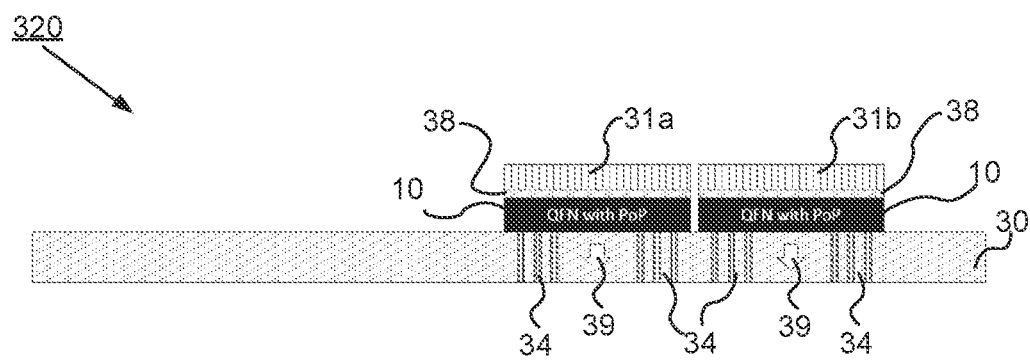

FIGS. 3a-3c illustrate examples of prior art embodiments of an electronic assembly.

FIG. 3a is an example of an electronic assembly 300 comprising a carrier substrate, e.g. a PCB, 30 having an antenna array 31 embedded in the carrier substrate 30. A ball grid array (BGA) 32 is provided on a first side of the carrier substrate 30, same as the antenna array 31. A BGA is a type of surface-mount packaging (a chip carrier) used for integrated circuits. BGA packages are used to permanently mount devices such as microprocessors. Heat is flowing up, as indicated by the arrow 33. A QFN 10 is mounted on a second side of the carrier substrate 30, opposite to the first side. Thermal vias 34 are provided through the carrier substrate 30, and heat generated in the QFN flow up (as indicated by 35) through the thermal vias 34 (only one is shown).

FIG. 3b is an example of an electronic assembly 310 comprising a carrier substrate, e.g. a PCB, 30 having an antenna array 31 mounted on a first side of the carrier substrate 30, e.g. using a BGA or Land grid array (LGA) socket. A BGA 32 is provided on a second side of the carrier substrate 30, opposite to the antenna array 31. Heat is flowing down, as indicated by the arrow 36. A QFN 10 is mounted on the first side of the carrier substrate 30. Thermal vias 34 are provided through the carrier substrate 30, and heat generated in the QFN flow down (as indicated by 37) through the thermal vias 34 (only one is shown).

FIG. 3c is an example of an electronic assembly 320 comprising a carrier substrate 30 having two antenna arrays 31a and 31b, with stacked antenna elements as Package on Package (PoP). The QFN 10 is on the same side as the antenna arrays, and heat flow down (as indicated by 39) through thermal vias 34. The antenna arrays are attached, as illustrated by 38, and could be BGA soldered as PoP.

Figure 4A:
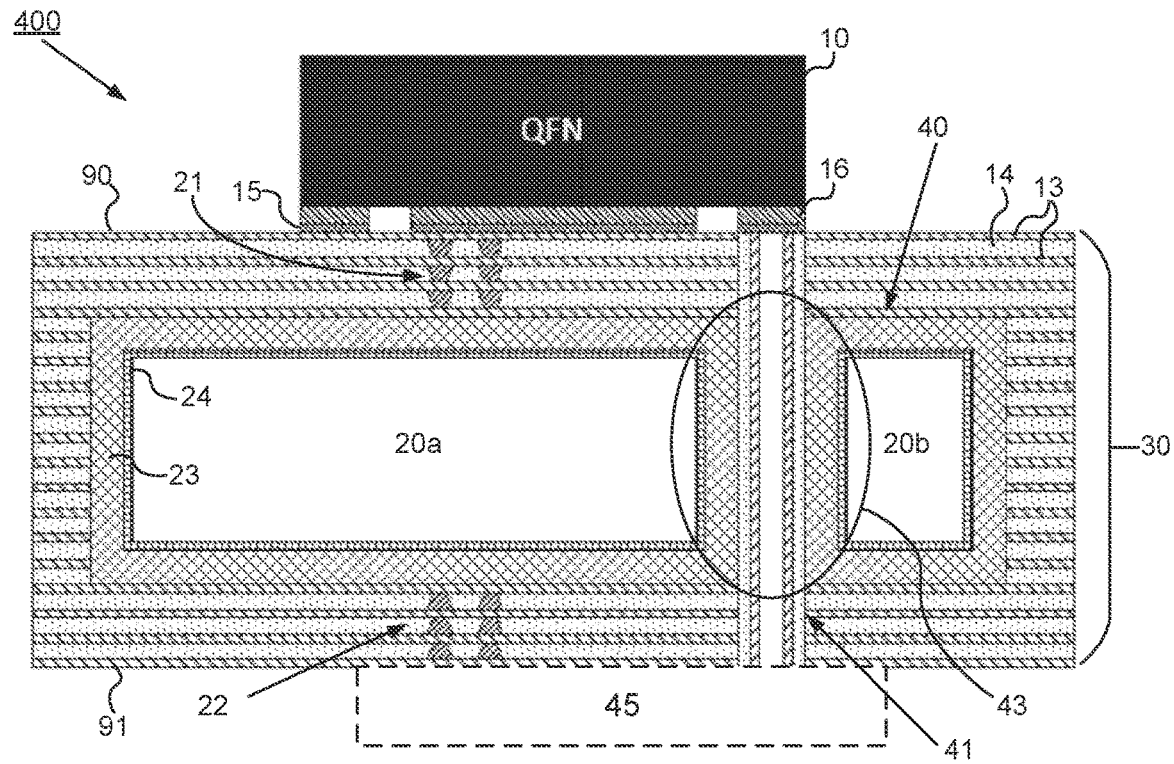
FIGS. 4a and 4b illustrate embodiments of improved cooling solutions in a carrier substrate with mounted heat generating components.
Figure 4B:
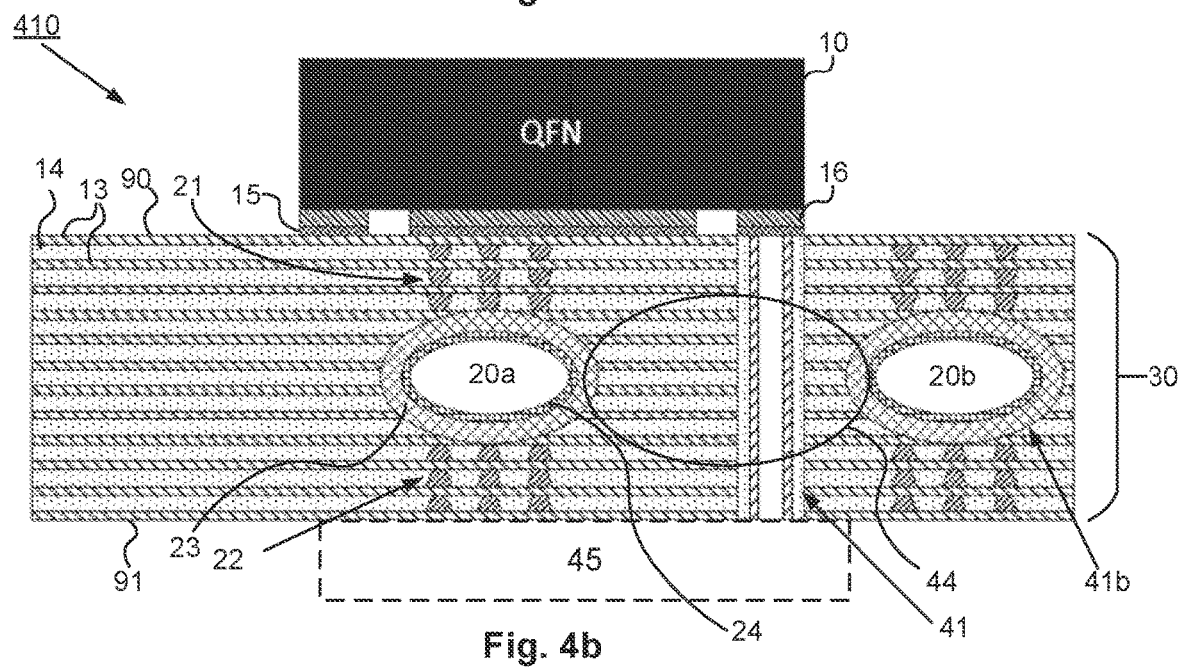

FIGS. 4a and 4b illustrate example embodiments of electronic assemblies with a carrier substrate 30, exemplified as a printed circuit board (PCB) having copper layers 13 and dielectric layers 14 in a laminated structure, with heat generating components, here illustrated as a QFN package 10 mounted to a top side 90 of the PCB. The QFN is soldered or attached, indicated by 15, to the top copper layer 12 via a copper pad 16 on the QFN 10.

The carrier substrate 30 comprises one or more signal vias 41 for electrically interconnecting components 10, 45 arranged on opposing sides of the carrier substrate 30. Different types of signal vias, such as buried vias, may be used. FIG. 10 illustrates some variants that may be implemented to achieve electrical interconnection between components arranged on opposite sides of the carrier substrate. The carrier substrate further comprises: at least one cavity 20a, 20b embedded in the carrier substrate 30 having at least one chamber wick part 24 and a working fluid, and a plurality of thermal vias 21, 22 for thermally interconnecting the opposing sides 90, 91 of the carrier substrate 30 via the at least one cavity 20a, 20b.

In FIG. 4a, an electronic assembly 400 is described in which the at least one cavity 20a, 20b is part of a vapor chamber 40. In the cross-sectional view, the vapor chamber 40 is illustrated having two interconnected cavities 20a, 20b sharing working fluid. According to some embodiments, the at least one cavity 20a, 20b is provided with at least one additional internal wall 43, and at least a part of the signal vias 41 are embedded within the at least one additional internal wall 43. The cavity of the vapor chamber 40 at least partially encompasses the signal via embedded in the additional internal wall 43. This is disclosed in more detail in connection with FIGS. 8a and 8b.

In FIG. 4b an alternative an electronic assembly 410 is described in which the at least one cavity 20a, 20b is multiple interconnected heat pipes 42a, 42b. In the cross-sectional view, the heat pipes 41a, 41b are illustrated having two interconnected cavities 20a, 20b sharing working fluid. According to some embodiments, the heat pipes are spaced apart thereby creating a space 44 in which at least a part of the signal vias 41 are provided through the carrier substrate.

According to some embodiments multiple cavities are embedded in the carrier substrate 30. These cavities may share working fluid, or operate independently of each other and use separate working fluids. According to some embodiments, the separate working fluids are different types of working fluids, configured to adapt to different working temperature ranges.

According to some embodiments the carrier substrate 30 has a laminated structure, e.g. a printed circuit board, and a laminated signal layer 13 is provided on opposing sides of the carrier substrate 30. According to some embodiments, the carrier substrate 30 comprises a plurality of stacked printed circuit boards being electrically and thermally interconnected.

With reference to FIGS. 5a-7, this disclosure also relates to an electronic assembly 500, 501, 510, 520 comprising a first heat generating component 10 thermally connected to a first side 90 of a carrier substrate 30, as described in connection with FIGS. 4a and 4b. The first heat generating component 10 is electrically connected to a second component 31; 60 arranged on a second side 91, opposite of the first side 90, of the carrier substrate 30 using signal vias 41.

According to some embodiments, the electronic assembly further comprises at least one passive cooling component (i.e. not including fans or water cooling) for removing generated heat from the carrier substrate 30, and the at least one passive cooling component is thermally connected to the carrier substrate 30. According to some embodiments the passive component comprises a heat sink 51 thermally connected to the carrier substrate 30 and the vapor chamber 40/heat pipe using thermal vias and/or a heat sink 61 thermally connected to one of the first or second components.

According to some embodiments, the heat generating component is an antenna array 31 and/or a ball grid array (BGA) and/or Quad Flat No-leads (QFN) packaged power amplifier (PA). In a typical example for a base station implementation, Radio Front end with PA, Low Noise Amplifier (LNA) and switch may be mounted on one side with supporting functions, digital signal functions (such as control and/or Digital Signal Processor (DSP)) and/or mixed signal functions (such as Analogue Digital Converter (ADC)/Digital Analogue Converter (DAC)), on the other side.

Figure 5A:
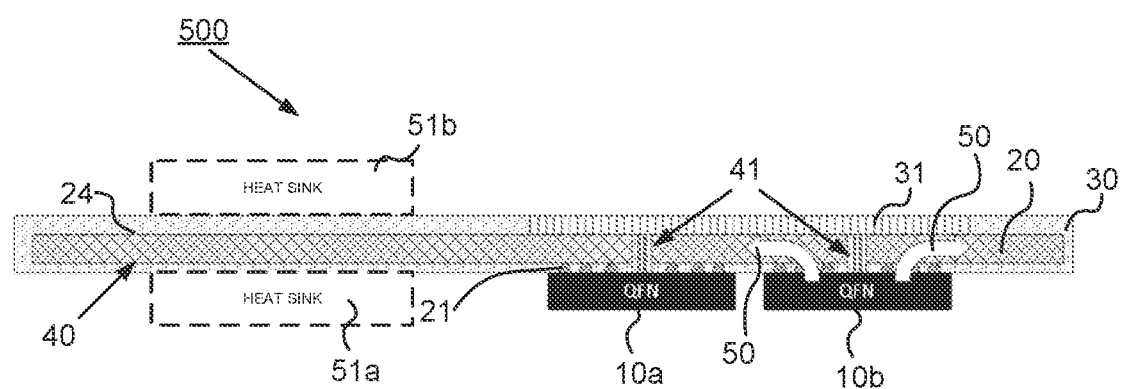
FIG. 5a illustrates a first building example of an improved cooling solution.

FIG. 5a illustrates a first example embodiment of an electronic assembly 500 comprising a first heat generating component, here illustrated as two QFNs 10a and 10b, thermally connected to a first side of a carrier substrate 30. In this example embodiment, the QFNs are electrically connected to a second component, e.g. an antenna array 31, arranged on a second side, opposite of the first side, of the carrier substrate 30 using signal vias 41. The heat generated in each QFN flows, as indicated by arrows 50, through an embedded vapor chamber 40 in the carrier substrate. The vapor chamber 40 is illustrated in a simplified manner, and comprises a cavity 20, and chamber wick part 24. The signal vias 41 pass through the cavity 20 in an additional internal wall provided with dielectric surrounding the signal via 41. Thermal vias 21 are provided between the first heat generating component 10 and the vapor chamber 40. Optionally, at least one passive cooling component 51a, 51b, such as a heat sink, may be thermally connected to the carrier substrate 30 and the vapor chamber 40, optionally via one or more thermal vias (not shown).

Figure 5B:
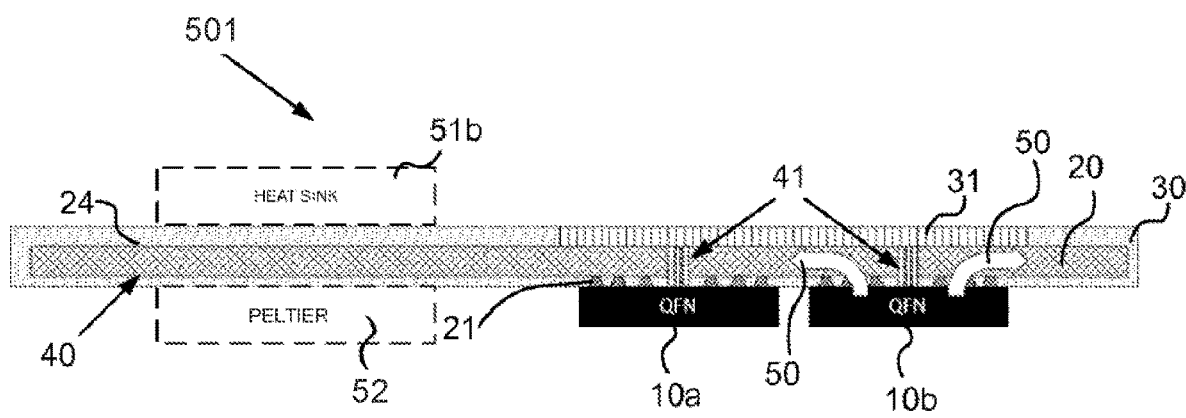
FIG. 5b illustrates the improved cooling solution of FIG. 5a, with an active temperature regulating component.

FIG. 5b illustrates an example embodiment of an electronic assembly 501. The electronic assembly 501 is similar to the electronic assembly 500 described above, with the substitution of an active temperature regulating component 52, in place of the passive cooling component 51b. The active temperature regulating component 52 is for regulating temperature in the cavity 20. The active temperature regulating component 52 is thermally connected to the cavity 20. In one embodiment, the active temperature regulating component 52 is a Peltier element thermally connected to the cavity using thermal vias.

Figure 6:
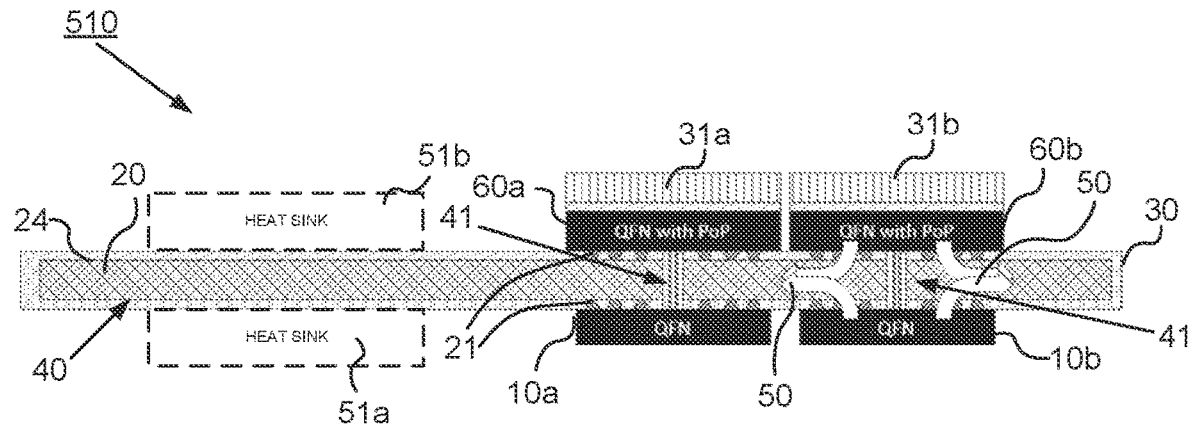
FIG. 6 illustrates a second building example of an improved cooling solution.

FIG. 6 illustrates a second example embodiment of an electronic assembly 510 comprising a first heat generating component, here illustrated as two QFNs 10a and 10b, thermally connected to a first side of a carrier substrate 30. In this example embodiment, the QFNs are electrically connected to a second heat generating component, here illustrated as two antenna arrays 31a and 31b created by a PoP on QFNs 60a and 60b, arranged on a second side, opposite of the first side, of the carrier substrate 30 using signal vias 41. The heat generated in each QFN flow, as indicated by arrows 50, through an embedded vapor chamber 40 in the carrier substrate. The vapor chamber 40 is illustrated in a simplified manner, and comprises a cavity 20, chamber wick part 24. The signal vias 41 pass through the cavity 20 in an additional internal wall provided with dielectric surrounding the signal via 41. Thermal vias 21 are provided between the first heat generating component 10a, 10b and the vapor chamber 40, and the second heat generating component 60a, 60b and the vapor chamber 40. According to some embodiments, at least one passive cooling component 51a, 51b, such as a heat sink, is thermally connected to the carrier substrate 30 and the vapor chamber 40, optionally via one or more thermal vias (not shown).

Figure 7:
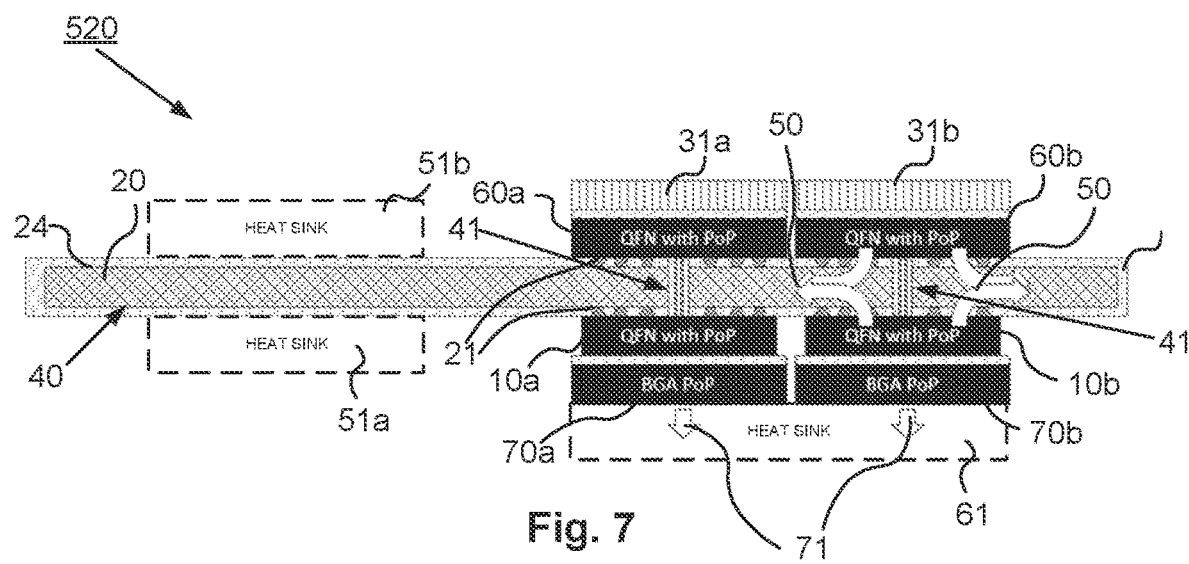
FIG. 7 illustrates a third building example of an improved cooling solution.

FIG. 7 illustrates a third example embodiment of an electronic assembly 520 comprising a first heat generating component, here illustrated as two QFNs 10a and 10b, thermally connected to a first side of a carrier substrate 30. In this example embodiment, the QFNs are electrically connected to a second heat generating component, here illustrated as two antenna arrays 31a and 31b created by a PoP on QFNs 45a and 45b, arranged on a second side, opposite of the first side, of the carrier substrate 30 using signal vias 41. The heat generated in each QFN flow, as indicated by arrows 50, through an embedded vapor chamber 40 in the carrier substrate. The vapor chamber 40 is illustrated in a simplified manner, and comprises a cavity 20, chamber wick part 24. The signal vias 41 pass through the cavity 20 in an additional internal wall provided with dielectric surrounding the signal via 41. Thermal vias 21 are provided between each first heat generating component 10a, 10b and the vapor chamber 40, and the second heat generating component 60a and 60b and the vapor chamber 40. According to some embodiments, at least one passive cooling component 51a, 51b, such as a heat sink, is thermally connected to the carrier substrate 30 and the vapor chamber 40, optionally via one or more thermal vias (not shown). Additional functionality is provided by BGA components 70a, 70b as PoP on QFN 10a and 10b respectively. Heat flow is also passing from top of BGA, as indicated by arrows 71. According to some embodiments, a passive cooling component 61, e.g. a heat sink, is thermally connected to the heat generating components 70a, 70b.

FIGS. 8a and 8b illustrate sectional views of a cooling structure including a laminated vapor chamber in a carrier substrate 30 with signal through vias 88. In this example embodiment, the vapor chamber comprises two chamber wick parts 81, 82 arranged on opposing walls of the cavity 20. An area 83 for condenser part is illustrated with dashed lines. Optionally, area 83 does not have to be provided with a chamber wick structure if gravity helps to move the fluid to an area with a wicking structure. The advantage is that the volume for gas increases in the cavity. Cooling both from bottom 91 and top 90 of carrier substrate 30 is possible. This area 83 may be placed generic. One or many openings 84 may be provided between channels to transfer heat to condenser part more easily. 85 illustrates an area for heat generating part. Heat may be generated both from bottom and top sides of the carrier substrate, and could be placed generic with supporting wick 81, 82. Walls 86 delimit the cavity of the vapor chamber and multiple internal walls 87 with embedded signal vias 88 are provided in the cavity 20. Thermal vias 89 are provided in the area 85 for heat generation.

FIGS. 9a and 9b illustrate sectional views of signal vias in a vapor chamber. A QFN package 10 is thermally connected to a vapor chamber by thermal vias with signal vias passing through the vapor chamber cavity 20, as described above in connection with FIGS. 4a and 4b. FIG. 9a illustrate the sectional view A-A from FIG. 9b comprising four signal vias. Signal via 94 is a single via arranged in an internal wall 97, and signal vias 95 are multiple vias arranged in an internal wall 98. Both pass through the cavity surrounded by the vapor chamber on all sides. However, signal via 96 is surrounded by the vapor chamber on three sides only.

FIG. 10 illustrates detailed examples of signal vias for electrically interconnecting components mounted on different sides of a carrier substrate 30. In FIGS. 1-9, the signal vias are schematically described in order to illustrate the advantages of the combination of signal vias having an encompassing cavity. In FIG. 10, different types of signal vias (plated through hole 41a and buried 41b) are illustrated together with a heat generating component 10.

What has been described is a vapor based heat spreader in combination with signal thru vias in the vapor chamber. The vapor chamber is used for transferring heat generated on both sides of the antenna carrier substrate, e.g. PCB, even with a stacked antenna array on active heat generating FE PAs. The heat could be generated in a small hotspot area, typically the array antenna part and transferred to the condenser part of the vapor chamber, where the heatsink typically is attached for heat convection to the environment. The concept with signal vias makes it possible to divide functionality and heat generation on two sides of the antenna carrier. This will reduce the effect of block thermal vias for signals.

Furthermore, this enable high functional density with heat generating components on two sides of a PCB, where the vapor function (in a cavity with at least one chamber wick part) is an excellent heat-spreader with through signal vias between components on the two PCB sides. This is typically not possible in a 5G mm wave antenna, where the antenna itself prevents cooling of the Front-End (FE) electronics on the antenna side, thus only allowing heat generating components on one side of the carrier substrate.

Furthermore, the vapor function may also be used to achieve an even temperature for the different electronic components, which are thermally connected to the vapor chamber/heat pipe, thereby ensuring no temperature gradient over the components. In addition, the vapor functionality may be used to regulate the working temperature of the electronic components, which are thermally connected to the vapor chamber/heat pipe, thereby ensuring a suitable working temperature. A suitable working temperature may be obtained either by using heat sinks to lower the temperature in the cavity, or by using heaters to increase the temperature in the cavity.

The electronic assembly described above may naturally be included as a component in an apparatus for wireless communication.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense only and not for purposes of limitation.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

An "apparatus for wireless communication" as the term may be used herein, is to be broadly interpreted to include a radiotelephone having ability for Internet/intranet access, web browser, organizer, calendar, a camera (e.g., video and/or still image camera), a sound recorder (e.g., a microphone), and/or global positioning system (GPS) receiver; a personal communications system (PCS) user equipment that may combine a mobile telephone with data processing; a tablet computer that can include a mobile telephone or wireless communication system; a laptop; a camera (e.g., video and/or still image camera) having communication ability; and any other computation or communication device capable of transceiving, such as a personal computer, a home entertainment system, a television, etc. In addition, an "apparatus for wireless communication" may also include base station components for cellular communication systems. Furthermore, a device may be interpreted as any number of antennas or antenna elements.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A carrier substrate, comprising:
   signal vias for electrically interconnecting components arranged on opposing sides of the carrier substrate; and
   at least one sealed cavity embedded in the carrier substrate having at least one chamber wick part and a working fluid;
   wherein the at least one cavity at least partially encompasses the signal vias.

2. The carrier substrate of claim 1, further comprising a plurality of thermal vias for thermally interconnecting the opposing sides of the carrier substrate via the at least one cavity.

3. The carrier substrate of claim 1, wherein the at least one cavity comprises two chamber wick parts arranged on opposing walls of the cavity.

4. The carrier substrate of claim 1, wherein the at least one cavity is part of a vapor chamber.

5. The carrier substrate of claim 4, wherein multiple cavities are embedded in the carrier substrate.

6. The carrier substrate of claim 1, wherein:
   the at least one cavity is provided with at least one additional internal wall; and
   at least a part of the signal vias are embedded within the at least one additional internal wall.

7. The carrier substrate of claim 1, wherein the at least one cavity is multiple interconnected heat pipes.

8. The carrier substrate of claim 7, wherein the heat pipes are spaced apart thereby creating a space in which at least a part of the signal vias are provided through the carrier substrate.

9. The carrier substrate of claim 1, wherein a laminated signal layer is provided on opposing sides of the carrier substrate.

10. The carrier substrate of claim 1, wherein the carrier substrate comprises a plurality of stacked printed circuit boards that are electrically and thermally interconnected.

11. An electronic assembly, comprising:
    a carrier substrate, the carrier substrate comprising:
       signal vias for electrically interconnecting components arranged on opposing sides of the carrier substrate; and
       at least one sealed cavity embedded in the carrier substrate having at least one chamber wick part and a working fluid;
       wherein the at least one cavity at least partially encompasses the signal vias;
    a first heat generating component thermally connected to a first side of the carrier substrate;
    wherein the first heat generating component is electrically connected to a second component arranged on a second side, opposite of the first side, of the carrier substrate using the signal vias.

12. The electronic assembly of claim 11, further comprising at least one passive cooling component for removing generated heat, wherein the at least one passive cooling component is thermally connected to the carrier substrate.

13. The electronic assembly of claim 12, wherein the passive cooling component comprises:
    a heat sink thermally connected to the carrier substrate using thermal vias; and/or
    a heat sink thermally connected to one of the first or second components.

14. The electronic assembly of claim 11, further comprising at least one active temperature regulating component for regulating temperature in the cavity, wherein the at least one active temperature regulating component is thermally connected to the cavity.

15. The electronic assembly of claim 14, wherein the temperature regulating component is a Peltier element thermally connected to the cavity using thermal vias.

16. The electronic assembly of claim 11, wherein the first heat generating component is an antenna array.

17. The electronic assembly of claim 11, wherein the second component is a second heat generating component thermally connected to the carrier substrate.

18. The electronic assembly of claim 17, wherein the second component is: a power amplifier, low noise amplifier, a switch, a control, a digital signal processor, an analog to digital converter, and/or a digital to analog converter.

19. An apparatus for wireless communication, comprising:
    an electronic assembly, comprising:
       a carrier substrate, the carrier substrate comprising:
          signal vias for electrically interconnecting components arranged on opposing sides of the carrier substrate; and
          at least one sealed cavity embedded in the carrier substrate having at least one chamber wick part and a working fluid;
          wherein the at least one cavity at least partially encompasses the signal vias;
       a first heat generating component thermally connected to a first side of the carrier substrate;
    wherein the first heat generating component is electrically connected to a second component arranged on a second side, opposite of the first side, of the carrier substrate using the signal vias.

* * * * *